United States Patent
Cheng et al.

(10) Patent No.: US 8,166,228 B2
(45) Date of Patent: Apr. 24, 2012

(54) NON-VOLATILE MEMORY SYSTEM AND METHOD FOR READING AND STORING SUB-DATA DURING PARTIALLY OVERLAPPING PERIODS

(75) Inventors: Chuang Cheng, Hsinchu (TW); Satashi Sugawa, Hsinchu (TW); Chih-Wei Tsai, Hsinchu (TW); Wen-Lin Chang, Hsinchu (TW); Fu-Ja Shone, Hsinchu (TW)

(73) Assignee: SkyMedi Corporation, Hsinchu (TW)

( * ) Notice: Subject to any disclaimer, the term of this patent is extended or adjusted under 35 U.S.C. 154(b) by 482 days.

(21) Appl. No.: 12/120,453

(22) Filed: May 14, 2008

(65) Prior Publication Data

US 2009/0043945 A1    Feb. 12, 2009

(30) Foreign Application Priority Data

Aug. 9, 2007  (TW) .............................. 96129365 A

(51) Int. Cl.
*G06F 12/00* (2006.01)

(52) U.S. Cl. ............ 711/103; 711/5; 711/127; 711/150; 711/154; 711/167; 711/168; 365/185.33

(58) Field of Classification Search .............. 711/5, 103, 711/127, 150, 154, 167, 168; 365/185.33
See application file for complete search history.

(56) References Cited

U.S. PATENT DOCUMENTS

| | | | | |
|---|---|---|---|---|
| 5,848,428 A * | 12/1998 | Collins | ........................ | 711/127 |
| 6,081,878 A * | 6/2000 | Estakhri et al. | ............... | 711/168 |
| 6,131,139 A | 10/2000 | Kikuchi et al. | | |
| 6,751,129 B1 | 6/2004 | Gongwer | | |
| 7,162,569 B2 | 1/2007 | Conley et al. | | |
| 7,171,529 B2 * | 1/2007 | Ajiro | ............................ | 711/157 |
| 2002/0067640 A1 * | 6/2002 | Pascucci | .................. | 365/185.11 |
| 2007/0106834 A1 * | 5/2007 | Murin et al. | .................. | 711/103 |

* cited by examiner

*Primary Examiner* — Arpan P. Savla

(74) *Attorney, Agent, or Firm* — Grossman, Tucker, Perrault & Pfleger, PLLC

(57) ABSTRACT

A non-volatile memory system and a method for reading data therefrom are provided. The data comprises a first sub-data and a second sub-data. The non-volatile memory system comprises a first storage unit and a second storage unit, adapted for storing the two sub-data respectively. The first storage unit reads a first command from the controller, and stores the first sub-data temporarily as the first temporary sub-data according to the first command. The second storage unit reads a second command from the controller, and stores the second sub-data temporarily as the second temporary sub-data according to the second command. The first temporary sub-data is read from the first storage unit. Then, the first storage unit reads a third command from the controller. The second temporary sub-data is also read from the second storage unit while reading the third command. The time for reading data from the non-volatile memory system is reduced.

20 Claims, 9 Drawing Sheets

NON-VOLATILE MEMORY SYSTEM AND METHOD FOR READING AND STORING SUB-DATA DURING PARTIALLY OVERLAPPING PERIODS

CROSS-REFERENCES TO RELATED APPLICATIONS

This application claims priority to Taiwan Patent Application No. 096129365 filed on Aug. 9, 2007, the disclosure of which is incorporated herein by reference in its entirety.

BACKGROUND OF THE INVENTION

1. Field of the Invention

The present invention relates to a non-volatile memory system and a method for reading data therefrom. More particularly, the present invention relates to a non-volatile memory system that allows data to be read quickly and a method for reading data therefrom.

2. Descriptions of the Related Art

The rapid pace of modern technology development has led to the proliferation of various information contents. Accordingly, a wide variety of storage media have emerged to facilitate data storage to record and store such information. Particularly, non-volatile memories, which can retain data without a power supply and allows data to be read and written repeatedly, have found a widespread use in many electronic products. Among these non-volatile memories, flash memories are gradually replacing other non-volatile memories such as magnetic disks or compact disks due to the flash memories' small profile, good portability, and convenience.

Generally, to read data from one of the storage units of a flash memory, the following sequence of steps are executed: a controller sending a command to a storage unit; the storage unit receiving an address of a sub-data of the data; all the sub-data being read from a storage array of the storage unit to a register of the storage unit according to the command and the address of the sub-data; and finally, the controller reading the sub-data from the register. Since the data typically comprises a plurality of sub-data, this sequence is then repeated until all the sub-data (i.e. the complete data) have been read.

With the rapid development of flash memories, each storage unit can now store increasingly more information, resulting in an increase of time needed to read data from the storage array to the register (tR). On the other hand, to reduce the time of reading data from the storage unit, there is less time spent on reading data from the register. However, due to various limitations, the extent to which the tR and tRC can be reduced is limited, therefore, it is important to develop a technology that can effectively reduce the time of data reading.

Presently, a number of technologies have been proposed in an effort to reduce the time needed to read data. For example, an apparatus for reading data from several flash memories and a method thereof have been disclosed in U.S. Pat. No. 6,131,139. According to the disclosure thereof, all the flash memories are first enabled, and then a read command and an address of data to be read are transmitted to the flash memories. Subsequently, a respective storage array in the flash memories stores the data temporarily into a respective register before the data is read from the individual memories. With this method, the temporary storage of data can be accomplished simultaneously for the individual flash memories, thereby, reducing the time needed to read data from the storage array to the register (tR). However, after completing the data reading from the individual flash memories, the next data reading operation still temporarily stores the data simultaneously, which means that the saved time is limited.

In summary, there are not many methods currently for reducing the time needed to read the data. Therefore, efforts still have to be made in the art to provide a mechanism that can effectively reduce the time of reading data from the memory, thereby, improving the overall performance of the memory.

SUMMARY OF THE INVENTION

One objective of this invention is to provide a non-volatile memory system for storing data, wherein the data comprises a plurality of sub-data, including a first sub-data and a second sub-data. The non-volatile memory system comprises a plurality of storage units and a controller. The plurality of storage units is configured to store the plurality of sub-data respectively according to a sequence, and comprises a first storage unit and a second storage unit. The controller is configured to send a first command to the first storage unit to read, and the first storage unit stores the first sub-data temporarily as a first temporary sub-data according to the first command. The controller sends a second command to the second storage unit to read, and the second storage unit stores the second sub-data temporarily as a second temporary sub-data according to the second command. The controller reads the first temporary sub-data from the first storage unit, and then sends a third command to the first storage unit to read.

Another objective of this invention is to provide a method for reading data from a non-volatile memory system, wherein the data comprises a plurality of sub-data, including a first sub-data and a second sub-data, and the non-volatile memory system comprises a plurality of storage units for storing the plurality of sub-data according to a certain sequence. The plurality of storage units comprises a first storage unit and a second storage unit. The method comprises the following steps: (a) sending a first command to the first storage unit to read; (b) storing the first sub-data temporarily as a first temporary sub-data according to the first command; (c) sending a second command to the second storage unit to read; (d) storing the second sub-data temporarily as a second temporary sub-data according to the second command; (e) reading the first temporary sub-data from the first storage unit; and (f) sending a third command to the first storage unit to read after executing step (e).

According to this invention, upon reading the first temporary sub-data from the first storage unit, the controller sends a next command so that the first storage unit can read the next command immediately. The second temporary sub-data can then be read from the second storage unit and another sub-data associated with the next command can be stored temporarily during this period, thus eliminating the latency time and saving a significant time of reading data.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
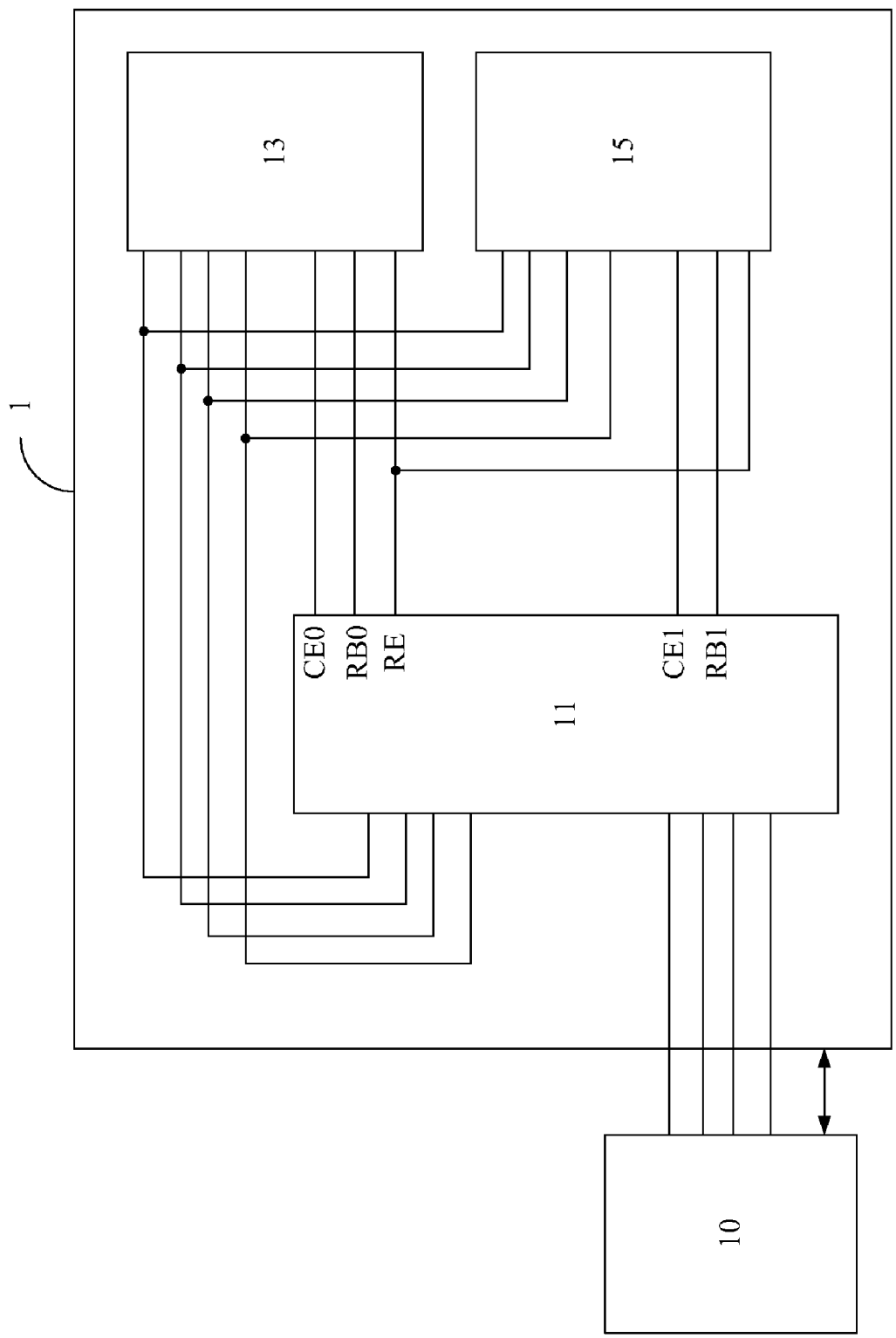
FIG. 1A is a schematic view of a non-volatile memory system in the first embodiment of the present invention.

A first embodiment of this invention is a non-volatile memory system 1 electrically connected with a processor 10, as shown in FIG. 1A. The non-volatile memory system 1 is configured to store data which comprises a plurality of sub-data. More specifically, the plurality of sub-data comprises a first sub-data, a second sub-data, a third sub-data and a fourth sub-data. The non-volatile memory system 1 comprises a plurality of storage units and a controller 11, which may be a memory controller. The processor 10 electrically connected to the non-volatile memory system 1 may be considered a host, which is configured to operate the controller 11 to read data from the non-volatile memory system 1.

The plurality of storage units comprise a first storage unit 13 and a second storage unit 15 electrically connected to the controller 11. The controller 11 is configured to receive a ready/busy signal from the first storage unit 13 and the second storage unit 15 respectively, so as to be electrically connected thereto respectively. The first storage unit 13 and the second storage unit 15 have a storage array 131, 151 and a register 133, 153 respectively, as shown in FIG. 1C. The storage unit may also comprise more than one register in other implementations. Each storage units is an electrically erasable programmable read-only memory (EEPROM) or an NAND flash memory.

Figure 1B:
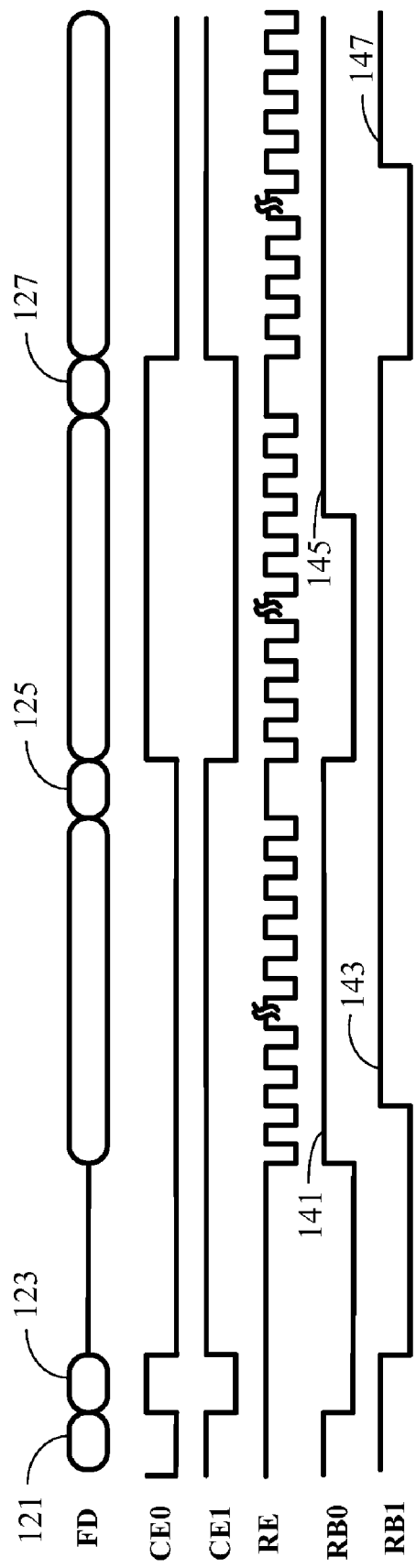
FIG. 1B is a timing diagram of reading data from the non-volatile memory system in the first embodiment of the present invention.
Figure 1C:
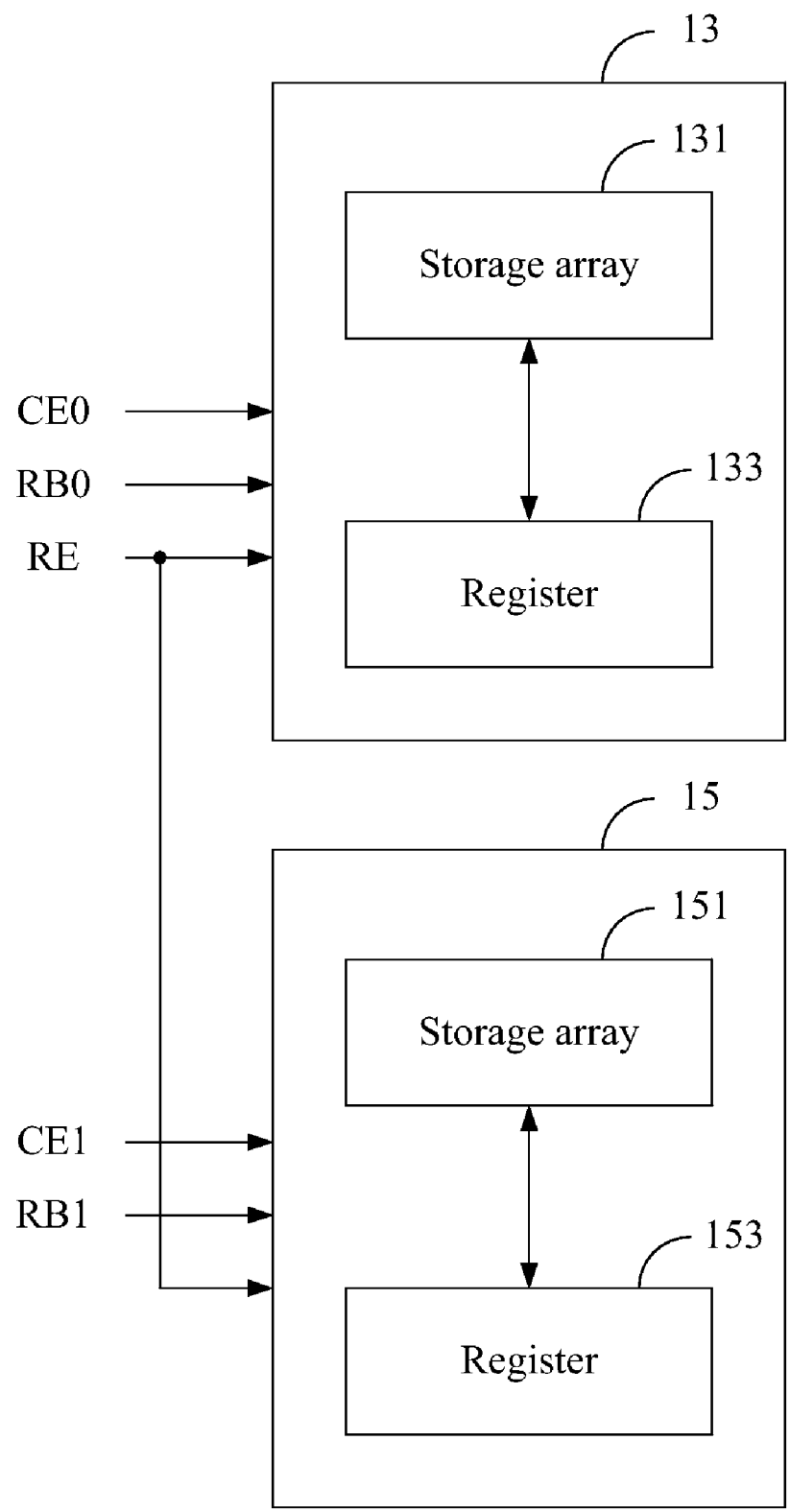
FIG. 1C is a schematic view of a storage unit of the first embodiment of the present invention.

FIG. 1B depicts a timing diagram for reading the first sub-data, the second sub-data, the third sub-data, and the fourth sub-data from the non-volatile memory system 1. In this timing diagram, "FD" represents the operations of the bus between the storage units and the controller 11, wherein the operations can be sending addresses or commands, reading or writing data, reading statuses, and so on,; that is, the function description of data storage in the non-volatile memory system 1. "RE" is the abbreviation of a read enable signal common to the first storage unit 13 and the second storage unit 15. The reading operation is enabled when this signal is at a low level. The RE signal may also be divided into a number of read enable signals for use by respective storage units in other implementations. "CE0" and "CE1" represent the waveforms of the chip enable signals of the first storage unit 13 and the second storage unit 15 respectively. The first storage unit 13 and the second storage unit 15 are enabled when these signals are at a low level. "RB0" and "RB1" represent the waveforms of the ready/busy signals of the first storage unit 13 and the second storage unit 15. A high level of these signals represents the readiness of the respective storage unit, while a low level represents a busy status. It should be noted that, for purpose of simplicity, some control signals necessary for reading data from the non-volatile memory system 1, such as a command latch enable (CLE) signal, an address latch enable (ALE) signal, a write enable (WE) signal are omitted in FIG. 1B, as is also the latter half of the waveforms for data reading. However, these timing diagrams will readily occur to those skilled in the art. Accordingly, FIG. 1A depict the circuitry of a part of signals, the bus of the other signals, such as write protect (WP) signals, are omitted which people skilled in this field may easily proceed with. The plurality of storage units is adapted to store these sub-data respectively in a certain order, and particularly, in the following order: the first storage unit 13, the second storage unit 15, the first storage unit 13, and the second storage unit 15. More specifically, the first sub-data and the third sub-data are stored in the storage array 131 of the first storage unit 13, while the second sub-data and the fourth sub-data are stored in the storage array 151 of the second storage unit 15.

When data needs to be read from the non-volatile memory system 1, the first storage unit 13 is first enabled; that is, the controller 11 controls the CE0 signal to transit to a low level; at this point, the RB0 signal stays at a high level, which represents the ready status of the first storage unit 13. The controller 11 then sends a first command 121 to the first storage unit 13 to read, and the first command 121 further comprises a first address where the first sub-data is stored in the first storage unit 13. In response to the first command 121, the first storage unit 13 loads the first sub-data in the storage array 131 of the first storage unit 13 to be temporarily stored in the register 133 of the first storage unit 13 as a first temporary sub-data; at this point, the RB0 signal is at a low level, which represents the first storage unit 13 is busy in temporary storing.

Subsequently, the second storage unit 15 is enabled. That is, the controller 11 controls the CE1 signal to transit to a low level. At this point, the RB1 signal stays at a high level, which represents a ready status of the second storage unit 15. The controller 11 then sends a second command 123 to the second storage unit 15 to read, and the second command 123 further comprises a second address where the second sub-data is stored in the second storage unit 15. In response to the second command 123, the second storage unit 15 loads the second sub-data in the storage array 151 of the second storage unit 15 to be temporarily stored in the register 153 of the second storage unit 15 as a second temporary sub-data. At this point, the RB1 signal is at a low level, which represents the second storage unit 15 is busy in temporary storing.

When the first storage unit 13 completes the temporary storage of the first sub-data, the RB0 signal is transited to a high level. That is, the first storage unit 13 transmits a first ready signal 141 to the controller 11, which then reads the first temporary sub-data from the first storage unit 13 in response to the first ready signal 141. In other words, the controller 11 controls the RE signal to toggle continuously. The CE0 signal is at a low level and the CE1 signal is at a high level, which means that the data needs to be read from the first storage unit. The first temporary sub-data is read, for example, to the processor 10.

Then, the controller 11 sends the third command 125 to the first storage unit 13 to read i.e. the controller 11 sets the CE0 signal at a low level to enable the reading of the third command 125. The third command 125 further comprises a third address where the third sub-data is stored in the first storage unit 13.

Upon the second storage unit 15 completing the temporary storage of the second sub-data, the RB1 signal transits to a high level. That is, the second storage unit 15 transmits a second ready signal 143 to the controller 11. After the first storage unit 13 has read the third command 125 sent from the controller 11, the controller 11 reads the second temporary sub-data from the second storage unit 15 in response to the second ready signal 143. In other words, the controller 11 controls the RE signal to toggle continuously. The CE0 signal is now at a high level and the CE1 signal is at a low level, which represents data needs to be read from the second storage unit. The second temporary sub-data is read, for example, to the processor 10.

After the first storage unit 13 has read the third command 125 sent from the controller 11, the first storage unit 13 further loads the third sub-data in the storage array 131 of the first storage unit 13 to be temporarily stored into the register 133 of the first storage unit 13 as a third temporary sub-data in response to the third command 125. At this point, the RB0 signal transits again to a low level, which represents the first storage unit 13 is busy in temporary storing. It should be noted that, reading the second temporary sub-data from the second storage unit 15 and temporarily storing the third sub-data in the first storage unit 13 may be executed simultaneously, thereby, reducing the time spent on temporary storage.

Once the second temporary sub-data has been read, the controller 11 sends a fourth command 127 to the second storage unit 15 to read, i.e. the controller 11 sets the CE1 signal at a low level to enable the reading of the fourth command 127. The fourth command 127 further comprises a fourth address where the fourth sub-data are stored in the second storage unit 15. Thereafter, in response to the fourth command 127, the second storage unit 15 loads the fourth sub-data in the storage array 151 of the second storage unit 15 to be temporarily stored into the register 153 of the second storage unit 15 as a fourth temporary sub-data. At this point, the RB1 signal transits again to a low level, which represents the second storage unit 15 is busy in temporary storing.

When the first storage unit 13 completes the temporary storage of the third sub-data, the RB0 signal transits to a high level; that is, the first storage unit 13 transmits a third ready signal 145 to the controller 11. Once the second storage unit 15 has read the fourth command 127 sent from the controller, the controller 11 reads the third temporary sub-data from the first storage unit 13 in response to the third ready signal 145. Specifically, the controller 11 controls the RE signal to toggle continuously, with the CE0 signal at a low level and the CE1 signal at a high level. At this point, the data need to be read from the first storage unit, and thus, the third temporary sub-data is read. Subsequently, in a similar way (not shown), the second storage unit 15 can transmit a fourth ready signal 147 to the controller 11 to indicate the completion of the temporary storage of the fourth temporary sub-data. Afterwards, the controller 11 reads the fourth temporary sub-data from the second storage unit 15 in response to the fourth ready signal 147. Specifically, the controller 11 controls the RE signal to toggle continuously with the CE0 signal is at a high level and the CE1 signal at a low level. At this point, the data needs to be read from the second storage unit, and thus, the fourth temporary sub-data is read.

As the aforesaid four temporary sub-data are all what is stored in the non-volatile memory system 1, once the controller 11 has read the first temporary sub-data from the first storage unit 13, the second temporary sub-data from the second storage unit 15, the third temporary sub-data from the first storage unit 13, and the fourth temporary sub-data from the second storage unit 15 respectively, data reading is completed.

Figure 2A:
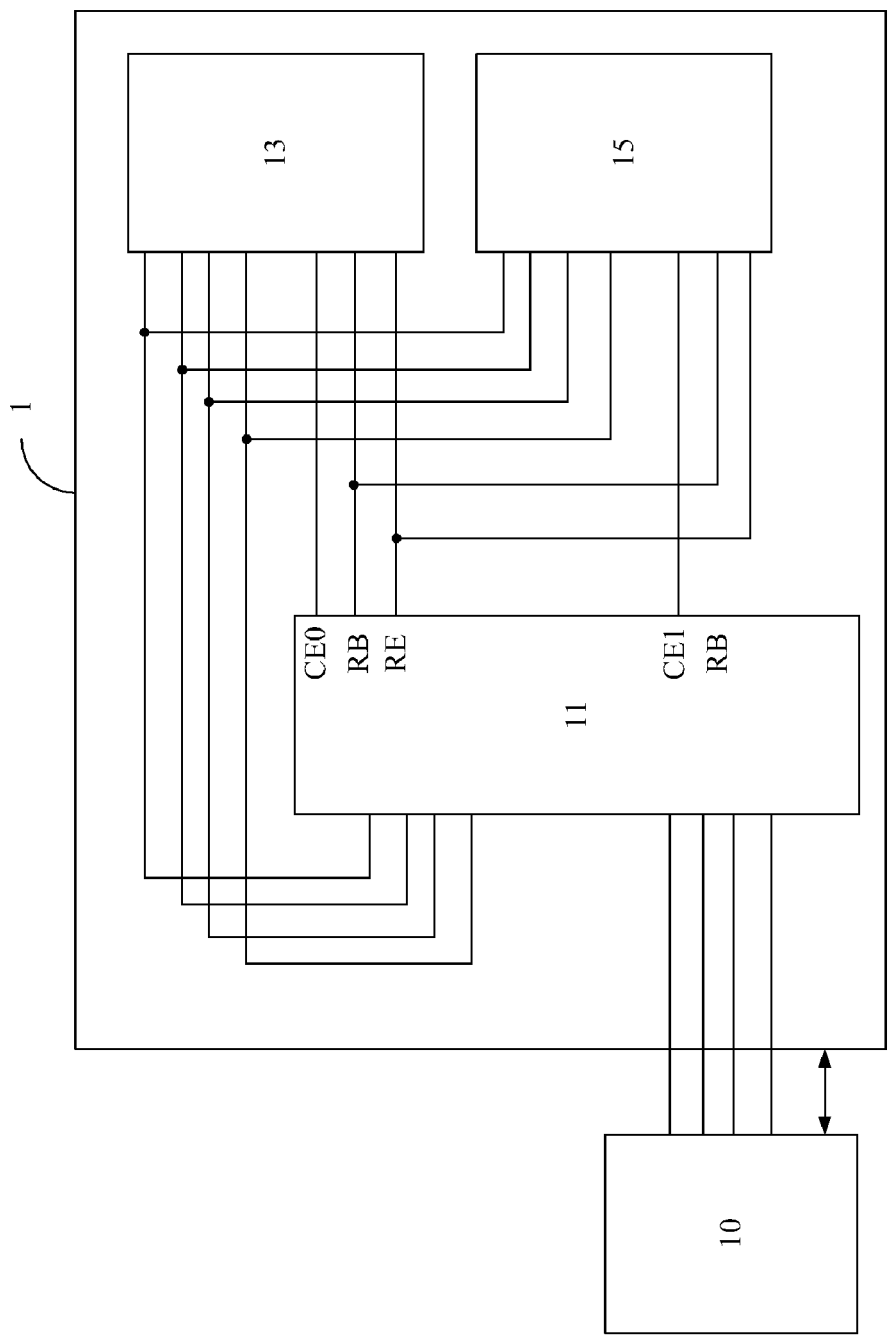
FIG. 2A is a schematic view of another aspect of the non-volatile memory system in the first embodiment of the present invention.

A structure of another aspect is depicted in FIG. 2A. Unlike the structure shown in FIG. 1A, the ready/busy signals of these storage units are all electrically connected to the controller 11, i.e., the ready/busy signals RB0 and RB1 of the first storage unit 13 and the second storage unit 15 are integrated into one ready/busy (RB) signal. In this structure, since the ready/busy signals from the first storage unit 13 and the second storage unit 15 can not be distinguished from each other, the first ready signal 141, the second ready signal 143, the third ready signal 145 and the fourth ready signal 147 are not transmitted to the controller 11. Consequently, the controller 11 does not know when to read the first temporary sub-data, the second temporary sub-data, the third temporary sub-data, and the fourth temporary sub-data.

Figure 2B:
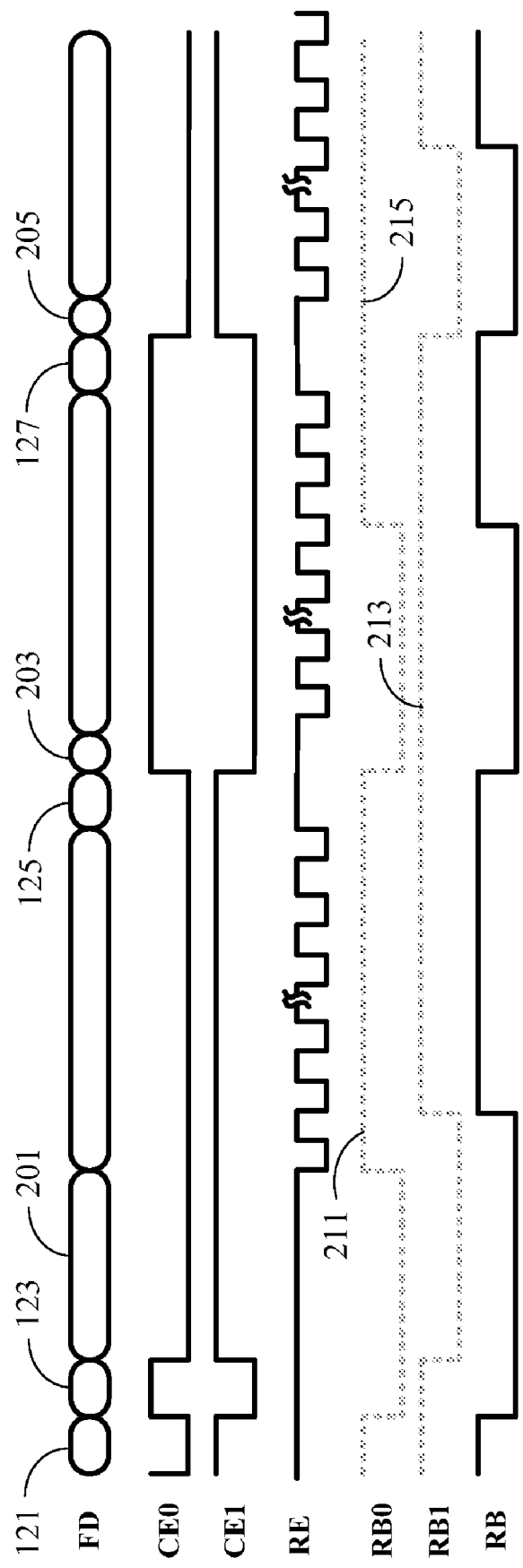
FIG. 2B is a timing diagram of reading data from the non-volatile memory system shown in FIG. 2A.

FIG. 2B is a timing diagram associated with the structure depicted in FIG. 2A. Once the second storage unit 15 has read a second command 123 sent from the controller 11, the controller 11 generates a first polling signal 201 to the first storage unit 13 to obtain a first ready status 211 of the first storage unit 13, so that the controller 11 can read the first temporary sub-data from the first storage unit 13 in response to the first ready status 211. Once the first storage unit 13 has read a third command 125 sent from the controller 11, the controller 11 generates a second polling signal 203 to the second storage unit 15 to obtain a second ready status 213 of the second storage unit 15, so that the controller 11 can read the second temporary sub-data from the second storage unit 15 in response to the second ready status 213. Once the second storage unit 15 has read a fourth command 127 sent from the controller 11, the controller 11 further generates a third polling signal 205 to the first storage unit 13 to obtain a third ready status 215 of the first storage unit 13, so that the controller 11 can read the third temporary sub-data from the first storage unit 13 in response to the third ready status 215. The controller 11 further generates a fourth polling signal (not shown) to the second storage unit 15 to obtain a fourth ready status (not shown) of the second storage unit 15, so that the controller 11 can read the fourth temporary sub-data from the second storage unit 15 in response to the fourth ready status.

Therefore, in the structure of this aspect, the controller 11 is still capable of reading all of the following: the first temporary sub-data from the first storage unit 13, the second temporary sub-data from the second storage unit 15, the third temporary sub-data from the first storage unit 13, and the fourth temporary sub-data from the second storage unit 15. After completion, the entire data have been read.

Figure 5:
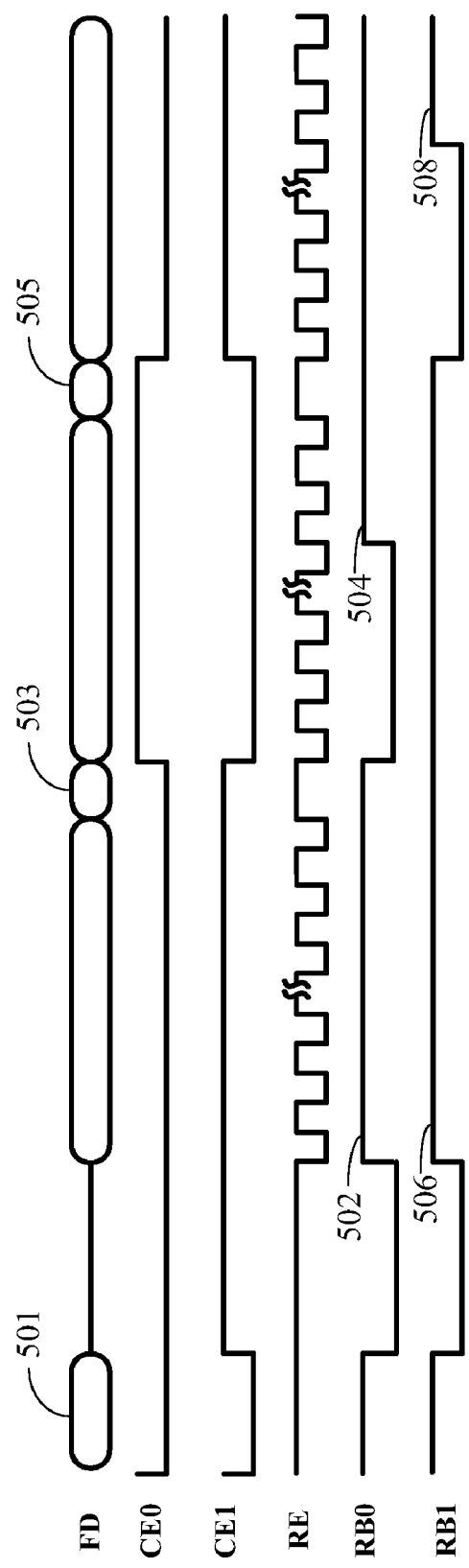
FIG. 5 is a timing diagram of another aspect of reading data from the non-volatile memory system shown in FIG. 1.

Another aspect of the structure is illustrated in FIG. 1A. In reference to FIG. 5, a timing diagram associated with the structure shown in FIG. 1A is also shown. In this structure, since the first storage unit 13 and the second storage unit 15 can be enabled simultaneously in an initial stage, sending a first command to the first storage unit 13 and sending a second command to the second storage unit 15 will overlap completely or partially. Subsequently, temporary storage of the first sub-data in the first storage unit 13 and the second sub-data in the second storage unit 15 may also overlap completely or partially. In this way, time can be saved when the controller 11 sends the first command and the second command to the first storage unit 13 and the second storage unit 15 to read and the first storage unit 13 and the second storage unit 15 temporarily store the sub-data.

More specifically, when the first command and the second command are sent to the first storage unit 13 and the second storage unit 15, respectively, the first storage unit 13 and the second storage unit 15 are enabled simultaneously, that is, the controller 11 controls both the CE0 signal and the CE1 signal to transit to a low level. At this point, both the RB0 and RB1 signals stay at a high level, which represents the ready status of both the first storage unit 13 and the second storage unit 15.

The controller 11 then sends the first command to the first storage unit 13 to read, and the first command further comprises a first address where the first sub-data is stored in the first storage unit 13. Simultaneously, the controller 11 also sends the second command to the second storage unit 15 to read, and the second command further comprises a second address where the second sub-data is stored in the second storage unit 15. Since the two commands can be sent and then read simultaneously, the two commands are denoted with a single reference numeral 501.

In response to the first command, the first storage unit 13 loads the first sub-data in the storage array 131 of the first storage unit 13 to be temporarily stored in the register 133 of the first storage unit 13 as the first temporary sub-data. Simultaneously, in response to the second command, the second storage unit 15 loads the second sub-data in the storage array 151 of the second storage unit 15 to be temporarily stored in the register 153 of the second storage unit 15 as the second temporary sub-data. At this point, both the RB0 and RB1 signals are at a low level, which represents a busy first storage unit 13 and second storage unit 15.

When the first storage unit 13 completes the temporary storage of the first sub-data, the RB0 signal transits to a high level; that is, the first storage unit 13 transmits a ready signal 502 to the controller 11 to inform the controller 11 that the temporary storage of the first sub-data has been completed. Similarly, when the second storage unit 15 completes the temporary storage of the second sub-data, the RB1 signal transits to a high level. That is, the second storage unit 15 transmits a ready signal 506 to the controller 11 to inform the controller 11 that the temporary storage of the second sub-data has been completed. Then, the controller 11 reads the first temporary sub-data from the first storage unit 13 in response to the ready signal 502. In other words, the controller 11 controls the RE signal to toggle continuously. The CE0 signal is now at a low level and the CE1 signal is at a high level, which represents that data needs to be read from the first storage unit, and thus, the first temporary sub-data is read, for example, to the processor 10.

Once the first temporary sub-data has been read, the controller 11 sends a third command 503 to the first storage unit 13 to read, i.e. the controller 11 sets the CE0 signal to a low level and sets the CE1 signal to a high level. The third command 503 further comprises a third address where the third sub-data is stored in the first storage unit 13. On the other hand, once the first storage unit 13 has read the third command 503 sent from the controller 11, the controller 11 reads the second temporary sub-data from the second storage unit 15 in response to the ready signal 506. In other words, the controller 11 controls the RE signal to toggle continuously. Now, the CE0 signal is at a high level and the CE1 signal is at a low level, which means that data needs to be read from the second storage unit, and thus, the second temporary sub-data is read.

Once the first storage unit 13 has read the third command 503 sent from the controller 11, the first storage unit 13 further loads the third sub-data in the storage array 131 of the first storage unit 13 to be temporarily stored into the register 133 of the first storage unit 13 as a third temporary sub-data in response to the third command 503. At this point, the RB0 signal transits again to a low level, which represents a busy first storage unit 13. It should be noted that the time it takes to read the second temporary sub-data from the second storage unit 15 and storing the third sub-data in the first storage unit 13 may overlap completely or partially, thereby, reducing the time spent in temporary storage.

Once the second temporary sub-data has been read, the controller 11 sends a fourth command 505 to the second storage unit 15 to read, i.e. the controller 11 sets the CE1 signal to a low level and the CE0 signal to a high level. The fourth command 505 further comprises a fourth address where the fourth sub-data is stored in the second storage unit 15. Thereafter, in response to the fourth command 505, the second storage unit 15 loads the fourth sub-data in the storage array 151 of the second storage unit 15 to be temporarily stored into the register 153 of the second storage unit 15 as a fourth temporary sub-data. At this point, the RB1 signal transits again to a low level, which represents a busy second storage unit 15.

When the first storage unit 13 completes the temporary storage of the third sub-data, the RB0 signal transits to a high level; that is, the first storage unit 13 transmits a ready signal 504 to the controller 11. Once the second storage unit 15 has read the fourth command 505 sent from the controller 11, the controller 11 reads the third temporary sub-data from the first storage unit 13 in response to the ready signal 504. Specifically, the controller 11 controls RE signal to toggle continuously. Now the CE0 signal is at a low level and the CE1 signal is at a high level, which means that data needs to be read from the first storage unit, and thus, the third temporary sub-data is read. Similarly, the time it takes to read the third temporary sub-data from the first storage unit 13 and storing the fourth sub-data in the second storage unit may overlap completely and partially. Subsequently, in a similar way (not shown), the second storage unit 15 also transmits another ready signal 508 to the controller 11 to indicate the completion of the temporary storage of the fourth temporary sub-data. Afterwards, the controller 11 reads the fourth temporary sub-data from the second storage unit 15 in response to the ready signal 508, i.e., the controller 11 controls the RE signal to toggle continuously.

As the aforesaid four sub-data are all what is stored in the non-volatile memory system 1, once the controller 11 has read the first temporary sub-data from the first storage unit 13, the second temporary sub-data from the second storage unit 15, the third temporary sub-data from the first storage unit 13, and the fourth temporary sub-data from the second storage unit 15 respectively, reading of the data is completed. If the RB0 signal of the first storage unit 13 and the RB1 signal of the second storage unit 15 are integrated into a single ready/busy signal (RB) in other implementations, the polling approach described above may be employed, which will not be described herein again.

With such a configuration and timing control described above, once a sub-data has been read from a register of an individual storage unit in a non-volatile memory system, the next command of the individual storage unit will be sent and then read first. The sub-data in the register of the next storage unit will only be read after the sending and the reading of the next command thereof. Simultaneously, according to the command it just read, the original storage unit may store an associated sub-data from the storage array into the register thereof. In this way, individual storage units in the non-volatile memory system may execute different tasks simultaneously, thereby, speeding up data reading.

Figure 3:
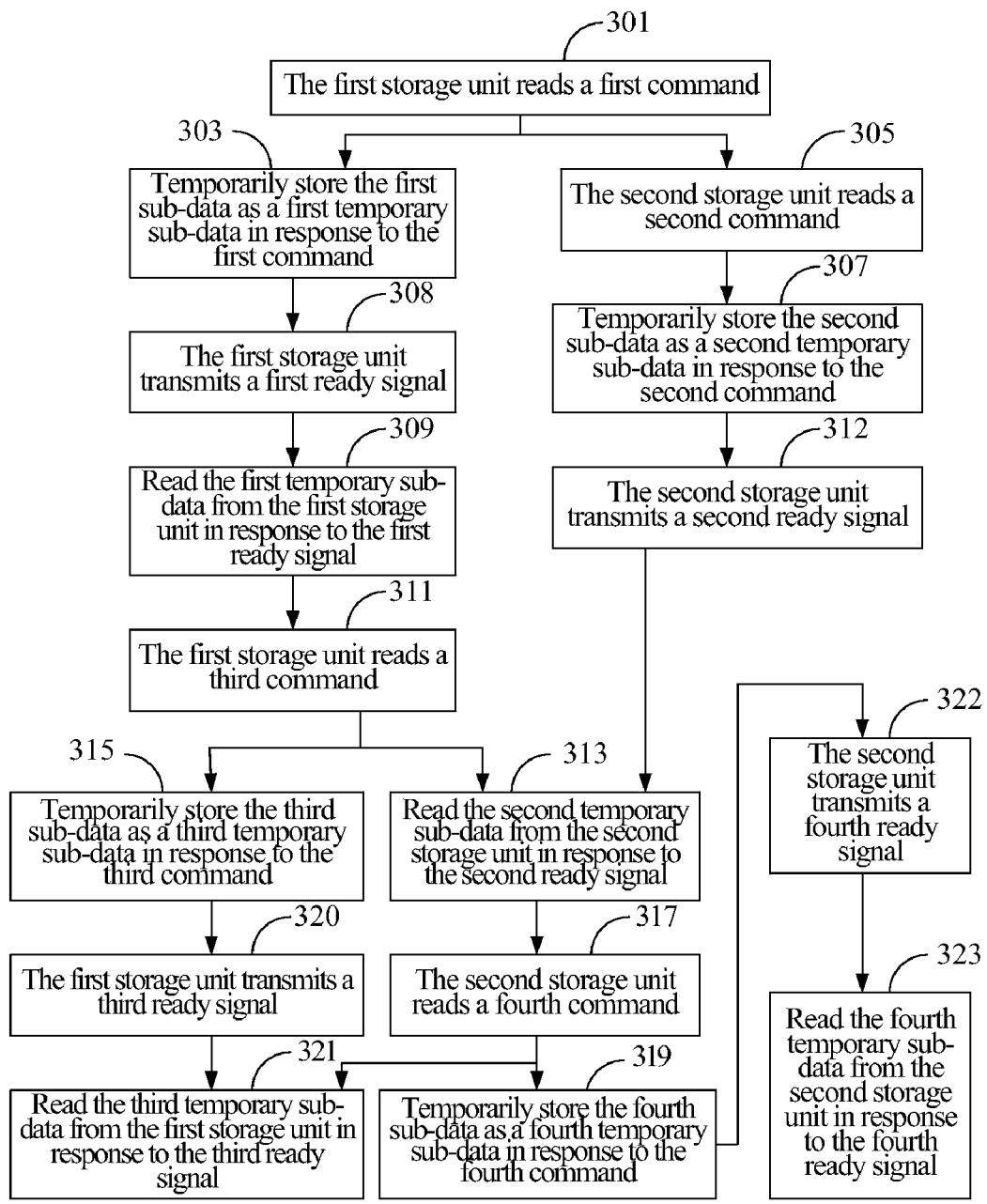
FIG. 3 is a flow diagram of a second embodiment of the present invention.

The second embodiment of this invention is a method for reading data from a non-volatile memory system. A flow diagram of which is depicted in FIG. 3. Here, the non-volatile memory system may be a non-volatile memory system 1 as described in the first embodiment.

The data comprises a plurality of sub-data, including a first sub-data, a second sub-data, a third sub-data and a fourth sub-data. The non-volatile memory system comprises a plurality of storage units for storing these sub-data respectively in a certain order. The plurality of storage units comprise a first storage unit and a second storage unit, the ready/busy signals of which are electrically connected to a controller separately.

The method for reading data from a non-volatile memory system comprises the following steps. Initially in step 301, sending a first command to the first storage unit to read is executed. Next in step 303, the first sub-data is stored temporarily as a first temporary sub-data according to the first command. Then, in step 305, after reading the first command in step 301, a second command is sent to the second storage unit to read. Here, the time it takes to execute step 303 and step 305 may overlap completely or partially. Subsequently in step 307, the second sub-data is stored temporarily as a second temporary sub-data according to the second command.

Upon completion of the temporary storage in step 303, the first storage unit transmits a first ready signal to the controller in step 308, with the first ready signal indicating that subsequent operations may be performed on the first temporary sub-data. Then in step 309, the first temporary sub-data is read from the first storage unit in response to the first ready signal, after which the controller sends a third command to the first storage unit to read in step 311.

Upon completion of the temporary storage in step 307, the second storage unit transmits a second ready signal to the controller in step 312, with the second ready signal indicating that subsequent operations may be performed on the second temporary sub-data. It should be emphasized that the time it takes to execute steps 303, 308, 309, 311 and steps 305, 307, 312 may overlapped completely or partially.

Upon completion of reading the third command in step 311, the second temporary sub-data is read from the second storage unit in step 313 in response to the second ready signal in step 312. Additionally, in step 315, after completion of reading the third command in step 311, the third sub-data is stored temporarily as a third temporary sub-data in response to the third command. Here, the time it takes to execute step 313 and step 315 may overlap completely or partially.

Upon completion of reading the second temporary sub-data in step 313, a fourth command is sent to the second storage unit to read in step 317. The fourth temporary sub-data is temporarily stored as a fourth temporary sub-data in response to the fourth command in step 319.

Upon completion of the temporary storage of the third sub-data in step 315, the first storage unit transmits a third ready signal to the controller in step 320, with the third ready signal indicating that subsequent operations may be performed on the third temporary sub-data. Step 321 is executed subsequent to step 317 and step 320, where the third temporary sub-data is read from the first storage unit in response to the third ready signal transmitted in step 320. Step 322 follows, in which the second storage unit transmits a fourth ready signal to the controller. The fourth ready signal indicates that subsequent operations may be performed on the fourth temporary sub-data, so that the fourth temporary sub-data is read from the second storage unit in response to the fourth ready signal in step 323. It should be emphasized that step 323 is executed after step 321 and step 322 and the time it takes to execute steps 315, 320 and steps 313, 317 may overlap completely or partially.

Figure 4:
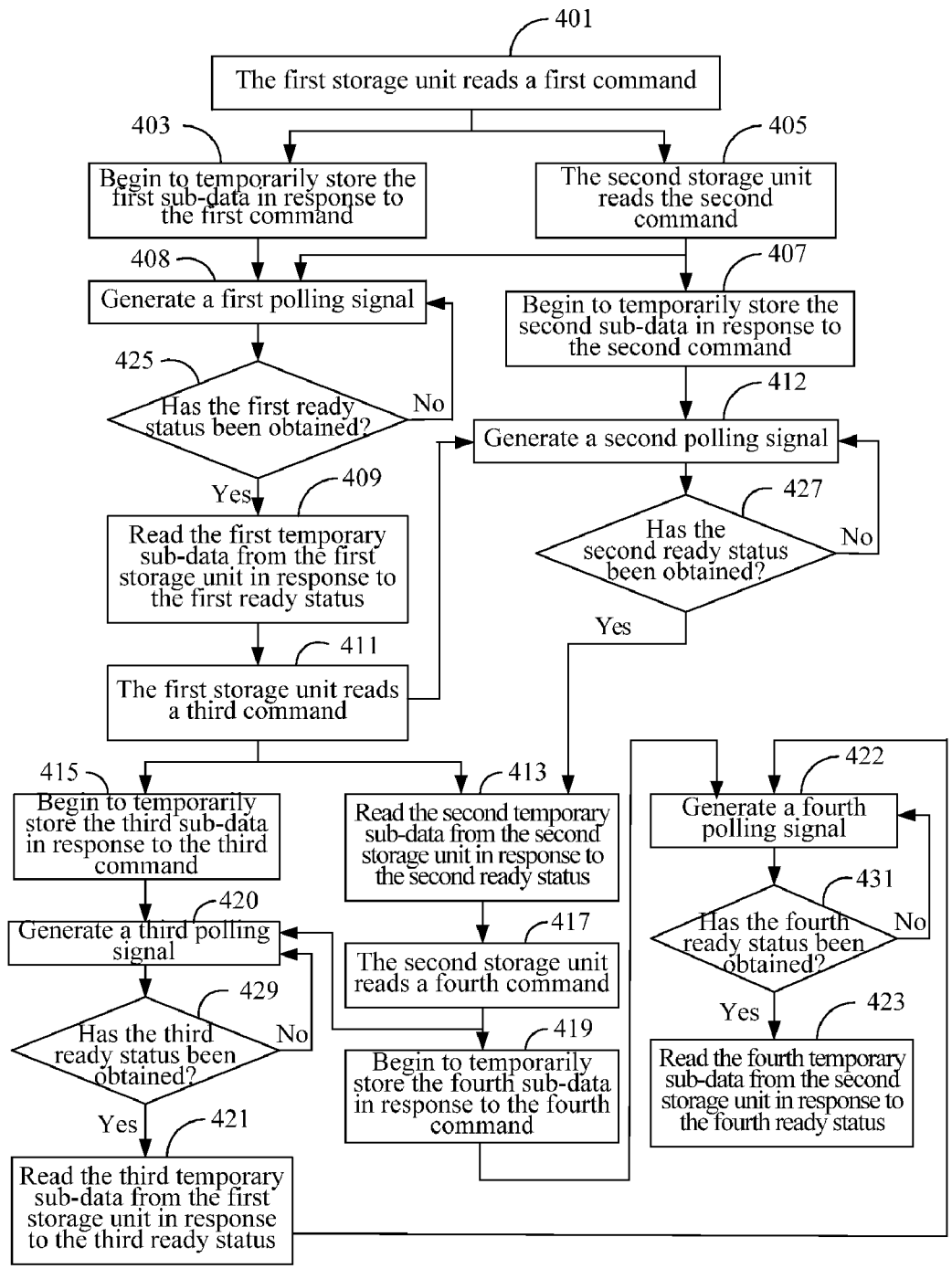
FIG. 4 is a flow diagram of another aspect of the second embodiment of the present invention.

This embodiment further has another aspect, a flow diagram of which is depicted in FIG. 4. In this aspect, the ready/busy signals of all storage units are all electrically connected to the controller, so the ready/busy signals of the first storage unit and the second storage unit can not be distinguished from each other. Hence, in this aspect, slight variations are made to steps 308, 309, 312, 313, 320, 321, 322 and 323 of the second embodiment to get steps 408, 409, 412, 413, 420, 421, 422 and 423 of this aspect. Steps of this aspect are as follows.

In step 401, sending the first command to the first storage unit to read is executed. In step 403, temporary storage of the first sub-data commences in response to the first command to obtain the first temporary sub-data. Upon completion of reading the first command in step 401, the second command is sent to the second storage unit to read in step 405. Here, the time it takes to execute step 403 and step 405 may overlap completely or partially. Subsequently in step 407, temporary storage of the second sub-data commences in response to the second command to obtain a second temporary sub-data.

Upon completion of the reading operation in step 405, steps 408 and 425 are executed sequentially to determine whether the first sub-data has been temporarily stored. In more detail, in step 408, the controller generates a first polling signal to the first storage unit, and then in step 425, it is determined whether a first ready status of the first storage unit has been obtained, i.e., whether the first sub-data has been temporarily stored as the first temporary sub-data. If not, the process returns to step 408; otherwise, in step 409, the first temporary sub-data is read from the first storage unit in response to the first ready status obtained in step 425. After the first temporary sub-data has been read, the process proceeds to step 411, where a third command the first storage unit is enabled to read.

Upon completion of the reading operation in step 411, steps 412 and 427 are executed sequentially to determine whether the second sub-data has been temporarily stored. In more detail, in step 412, the controller generates a second polling signal to the second storage unit. In step 427, it is determined whether a second ready status of the second storage unit has been obtained, i.e., whether the second sub-data has been temporarily stored as the second temporary sub-data. Here, the second ready status indicates that subsequent operations may be performed on the second temporary sub-data. It should be emphasized that the time it takes to execute steps 408, 425, 409, 411 and step 407 may overlap completely or partially.

If in step 427, the second ready status of the second storage unit has not been obtained, then the process returns to step 412. Otherwise, the process proceeds to step 413, at which time the reading of the third command in step 411 must have been completed. In step 413, the second temporary sub-data is read from the second storage unit in response to the second ready status. Additionally, also performed subsequently to step 411, step 415 is executed, where the third sub-data is temporarily stored as the third temporary sub-data in response to the third command. The time it takes to execute step 413 and step 415 may overlap completely or partially.

Upon completion of reading the second temporary sub-data in step 413, a fourth command is sent to the second storage unit to read in step 417. The fourth temporary sub-data is temporarily stored as the fourth temporary sub-data in response to the fourth command in step 419. The time it takes to execute step 415 and steps 413, 417 may be overlap completely or partially.

Upon completion of reading the fourth command in step 417, steps 420 and 429 are executed sequentially to determine whether the third sub-data has been temporarily stored. In more detail, in step 420, the controller generates a third polling signal to the first storage unit, and then in step 429, it is determined whether a third ready status of the first storage unit has been obtained, i.e., whether the third sub-data has been temporarily stored as the third temporary sub-data. Here, the third ready status indicates that subsequent operations may be performed on the third temporary sub-data. If the first storage unit is not ready, the process returns to step 420. Otherwise, in step 421, the third temporary sub-data is read from the first storage unit in response to the third ready status.

Following step 421, steps 422 and 431 are executed sequentially to determine whether the fourth sub-data has been temporarily stored. In more detail, in step 422, the controller generates a fourth polling signal to the second storage unit, and then in step 431, it is determined whether a fourth ready status of the second storage unit has been obtained, i.e., whether the fourth sub-data has been temporarily stored as the fourth temporary sub-data. Here, the fourth ready status indicates that subsequent operations may be performed on the fourth temporary sub-data. Then in step 423, the fourth temporary sub-data is read from the second storage unit in response to the fourth ready status. It should be emphasized that the time it takes to execute step 419 and steps 420, 429, 421 may overlap completely or partially.

Figure 6:
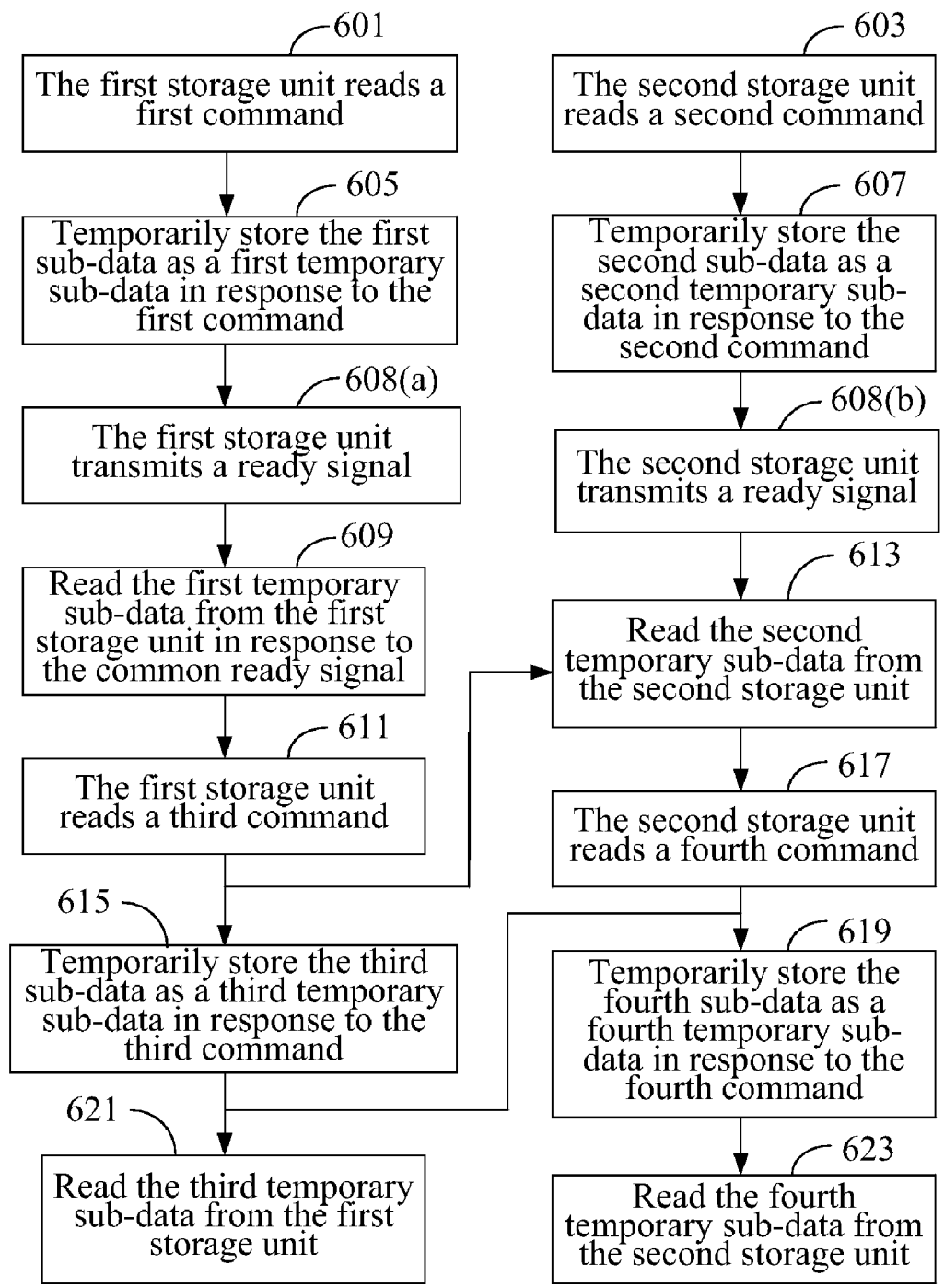
FIG. 6 depicts a flow diagram of yet another aspect of the second embodiment of the present invention.

The steps of this invention are not limited to the order described in the above embodiments and implementations. For example, this invention further has another aspect, a flow diagram of which is depicted in FIG. 6. In this aspect, the time it takes to read the first command by the first storage unit and the second command by the second storage unit may overlap completely or partially. Subsequently, the time it takes to temporarily store the first sub-data in the first storage unit and temporarily store the second sub-data in the second storage unit may also overlap in time completely or partially. Steps of this aspect are as follows.

In step 601, sending a first command to the first storage unit to read, and in step 603, a second command is sent to the second storage unit to read. Here, the execution of step 601 and step 603 may overlap completely or partially. In step 605, the first sub-data is temporarily stored as the first temporary sub-data in response to the first command, and in step 607, the second sub-data is temporarily stored as the second temporary sub-data in response to the second command. Also, the execution of step 605 and step 607 may overlap completely or partially. In this case, execution of steps 601 and 603 as a whole and execution of steps 605 and 607 as a whole may overlap completely or partially.

Upon completion of the temporary storing operation in steps 605 and 607, the first storage unit and the second storage unit transmit ready signals respectively in steps 608(a) and 608(b), indicating that subsequent operations may be performed on the first temporary sub-data. Then in step 609, the first temporary sub-data is read from the first storage unit in response to the ready signals. Thereafter, a third command is sent to the first storage unit to read in step 611.

After completion of reading the third command in step 611 and transmission of the ready signal by the second storage unit in step 608(b), the second temporary sub-data is read from the second storage unit in step 613. Additionally, step 615 is also executed subsequent to step 611, where the third sub-data is temporarily stored as a third temporary sub-data in response to the third command. The execution of step 613 and step 615 may overlap completely or partially.

Once the reading of the second temporary sub-data has completed in step 613, a fourth command is sent to the second storage unit to read in step 617. Then in step 619, the fourth sub-data is temporarily stored as the fourth temporary sub-data in response to the fourth command.

After the third sub-data has been temporarily stored in step 615 and the fourth command has been read in step 617, the process proceeds to step 621, where the third temporary sub-data is read from the first storage unit. Following step 617 is step 619, where the fourth sub-data is temporarily stored, so that the fourth temporary sub-data is read from the second storage unit in step 623. It should be emphasized that the execution of step 615 and execution of steps 613, 617 may overlap completely or partially.

In addition to the above steps, all the steps or functions set forth in the first embodiment or other implementations thereof may also be executed in the second embodiment and other implementations thereof. The corresponding steps of the second embodiment will be apparent to those skilled in the art upon reviewing descriptions of the first embodiment, and therefore, will not be described in detail herein.

The numbers of storage units, sub-data and temporary sub-data described in the above embodiments are only for purpose of description, and are not limited thereto.

By means of the well-ordered operations of this invention, while a temporary sub-data is read from a register of a storage unit, the sub-data can be stored simultaneously from a storage array of a previous storage unit. Therefore, temporary sub-data can be read at the same time that the next sub-data is temporarily stored in a non-volatile memory system, thus reducing the overall reading time significantly. In other words, in a non-volatile system, time spent on the first storage unit is measured only from temporarily storing the first sub-data from the storage array to the register thereof, while the subsequent temporarily storing operation may be done almost at the same time when the sub-data is being read from the register. In this way, the latency time of waiting for storing data temporarily is eliminated, thus, effectively reducing the time it takes to read data from the memory and thereby, improve the overall performance of the memory.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A non-volatile memory system for storing data, the data comprising a plurality of sub-data, the plurality of sub-data having a first sub-data, a second sub-data, and a third sub-data, the non-volatile memory system comprising:
   a plurality of storage units that store the plurality of sub-data respectively according to a sequence, and the plurality of storage units having a first storage unit and a second storage unit; and
   a controller that sends a first command to the first storage unit to read so that the first storage unit stores the first sub-data temporarily as a first temporary sub-data according to the first command, that sends a second command to the second storage unit to read so that the second storage unit stores the second sub-data temporarily as a second temporary sub-data according to the second command, that reads the first temporary sub-data from the first storage unit, that sends a third command to the first storage unit to read so that the first storage unit stores the third sub-data temporarily as a third temporary sub-data according to the third command, and that reads the second temporary sub-data from the second storage unit;
   wherein a time for storing the first sub-data temporarily as the first temporary sub-data partially overlaps with a time for storing the second sub-data temporarily as the second temporary sub-data, and a time for reading the second temporary sub-data from the second storage unit partially overlaps with a time for storing the third sub-data temporarily as the third temporary sub-data.

2. The non-volatile memory system as claimed in claim 1, wherein the plurality of sub-data further have a fourth sub-data, the controller further sends a fourth command to the second storage unit to read, and the second storage unit stores the fourth sub-data temporarily as a fourth temporary sub-data according to the fourth command.

3. The non-volatile memory system as claimed in claim 2, wherein after the second storage unit reads the fourth command sent from the controller, the controller further reads the third temporary sub-data from the first storage unit and reads the fourth temporary sub-data from the second storage unit.

4. The non-volatile memory system as claimed in claim 3, wherein each of the storage units has a storage array and at least one register, the first sub-data and the third sub-data are stored in the storage array of the first storage unit, the second sub-data and the fourth sub-data are stored in the storage array of the second storage unit, the first temporary sub-data and the third temporary sub-data are stored in the register of the first storage unit, and the second temporary sub-data and the fourth temporary sub-data are stored in the register of the second storage unit.

5. The non-volatile memory system as claimed in claim 3, wherein the first command comprises a first address, the first sub-data is stored at the first address of the first storage unit, the second command comprises a second address, the second sub-data is stored at the second address of the second storage unit, the third command comprises a third address, the third sub-data is stored at the third address of the first storage unit, the fourth command comprises a fourth address, and the fourth sub-data is stored at the fourth address of the second storage unit.

6. The non-volatile memory system as claimed in claim 3, wherein the first storage unit and the second storage unit are separately electrically connected to the controller, the first storage unit further transmits a first ready signal to the controller, the controller reads the first temporary sub-data from the first storage unit in response to the first ready signal, the second storage unit further transmits a second ready signal to the controller, and the controller reads the second temporary sub-data from the second storage unit in response to the second ready signal.

7. The non-volatile memory system as claimed in claim 6, wherein the first storage unit further transmits a third ready signal to the controller, the controller reads the third temporary sub-data from the first storage unit in response to the third ready signal, the second storage unit further transmits a fourth ready signal to the controller, and the controller reads the fourth temporary sub-data from the second storage unit in response to the fourth ready signal.

8. The non-volatile memory system as claimed in claim 3, wherein the storage units are electrically connected to the controller, the controller further generates a first polling signal to obtain a first ready status of the first storage unit, the controller reads the first temporary sub-data from the first storage unit according to the first ready status, the controller further generates a second polling signal to obtain a second ready status of the second storage unit, and the controller reads the second temporary sub-data from the second storage unit according to the second ready status.

9. The non-volatile memory system as claimed in claim 8, wherein the controller further generates a third polling signal to obtain a third ready status of the first storage unit, the controller reads the third temporary sub-data from the first storage unit in response to the third ready status, the controller further generates a fourth polling signal to obtain a fourth ready status of the second storage unit, and the controller reads the fourth temporary sub-data from the second storage unit in response to the fourth ready status.

10. The non-volatile memory system as claimed in claim 1, wherein each of the storage units is an Electrically Erasable Programmable Read Only Memory (EEPROM) or a NAND flash memory.

11. A method for reading data from a non-volatile memory system, the data comprising a plurality of sub-data, the plurality of sub-data having a first sub-data, a second sub-data and a third sub-data, the non-volatile memory system comprising a plurality of storage units for storing the plurality of sub-data according to a sequence, the plurality of storage units having a first storage unit and a second storage unit, the method comprising the following steps of:
(a) sending a first command to the first storage unit to read;
(b) storing the first sub-data temporarily as a first temporary sub-data according to the first command;
(c) sending a second command to the second storage unit to read;
(d) storing the second sub-data temporarily as a second temporary sub-data according to the second command, wherein a time for storing the first sub-data temporarily as the first temporary sub-data partially overlaps with a time for storing the second sub-data temporarily as the second temporary sub-data;
(e) reading the first temporary sub-data from the first storage unit;
(f) sending a third command to the first storage unit to read after executing the step (e);
(g) reading the second temporary sub-data from the second storage unit after executing the step (f); and
(h) storing the third sub-data temporarily as a third temporary sub-data according to the third command, wherein a time for reading the second temporary sub-data from the second storage unit partially overlaps with a time for storing the third sub-data temporarily as the third temporary sub-data.

12. The method as claimed in claim 11, wherein the plurality of sub-data further has a fourth sub-data, and the method further comprises the following steps of:
(i) sending a fourth command to the second storage unit to read after executing the step (g); and
(j) storing the fourth sub-data temporarily as a fourth temporary sub-data according to the fourth command.

13. The method as claimed in claim 12, further comprising the following steps of:
(k) reading the third temporary sub-data from the first storage unit after executing the step (i); and
(l) reading the fourth temporary sub-data from the second storage unit.

14. The method as claimed in claim 13, wherein each of the storage unit has a storage array and at least one register, the first sub-data and the third sub-data are stored in the storage array of the first storage unit, the second sub-data and the fourth sub-data are stored in the storage array of the second storage unit, the first temporary sub-data and the third temporary sub-data are stored in the register of the first storage unit, and the second temporary sub-data and the fourth temporary sub-data are stored in the register of the second storage unit.

15. The method as claimed in claim 13, wherein the first command comprises a first address, the first sub-data is stored at the first address of the first storage unit, the second command comprises a second address, the second sub-data is stored at the second address of the second storage unit, the third command comprises a third address, the third sub-data is stored at the third address of the first storage unit, the fourth command comprises a fourth address, and the fourth sub-data is stored at the fourth address of the second storage unit.

16. The method as claimed in claim 13, further comprising the following steps of:
   controlling the first storage unit to transmit a first ready signal, thereby the step (e) would be executed correspondingly; and
   controlling the second storage unit to transmit a second ready signal, thereby the step (g) would be executed correspondingly.

17. The method as claimed in claim 16, further comprising the following steps of:
   controlling the first storage to transmit a third ready signal, thereby the step (k) would be executed correspondingly; and
   controlling the second storage unit to transmit a fourth ready signal, thereby the step (l) would be executed correspondingly.

18. The method as claimed in claim 13, further comprising the following steps of:
   generating a first polling signal to the first storage unit to obtain a first ready status of the first storage unit, thereby the step (e) would be executed correspondingly; and
   generating a second polling signal to the second storage unit to obtain a second ready status of the second storage unit, thereby the step (g) would be executed correspondingly.

19. The method as claimed in claim 18, further comprising the following steps of:
   generating a third polling signal to the first storage unit to obtain a third ready status of the first storage unit, thereby the step (k) would be executed correspondingly; and
   generating a fourth polling signal to the storage unit to obtain a fourth ready status of the second storage unit, thereby the step (l) would be executed correspondingly.

20. The method as claimed in claim 11, wherein each of the storage units is an EEPROM or a NAND flash memory.

* * * * *